United States Patent
Chen et al.

(10) Patent No.: US 8,529,783 B2
(45) Date of Patent: Sep. 10, 2013

(54) METHOD FOR BACKSIDE POLYMER REDUCTION IN DRY-ETCH PROCESS

(75) Inventors: Huang-Ming Chen, Dongshan Township, Yilan County (TW); Chun-Li Chou, Sinhuang (TW); Chao-Cheng Chen, Chong-Ling (TW); Hun-Jan Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 606 days.

(21) Appl. No.: 12/798,201

(22) Filed: Mar. 30, 2010

(65) Prior Publication Data

US 2010/0190349 A1    Jul. 29, 2010

Related U.S. Application Data

(62) Division of application No. 10/765,808, filed on Jan. 27, 2004, now Pat. No. 7,713,380.

(51) Int. Cl.
*H01L 21/302* (2006.01)

(52) U.S. Cl.
USPC .............. 216/67; 134/1.2; 438/714; 438/715; 438/906; 438/928

(58) Field of Classification Search
None
See application file for complete search history.

(56) References Cited

U.S. PATENT DOCUMENTS

| | | | |
|---|---|---|---|
| 5,270,266 A * | 12/1993 | Hirano et al. | 438/715 |
| 5,444,207 A | 8/1995 | Sekine et al. | |
| 5,529,657 A | 6/1996 | Ishii | |
| 5,556,500 A | 9/1996 | Hasegawa et al. | |
| 5,748,434 A | 5/1998 | Rossman et al. | |
| 5,976,310 A | 11/1999 | Levy | |
| 5,993,594 A | 11/1999 | Wicker et al. | |
| 5,998,932 A | 12/1999 | Lenz | |
| 6,022,809 A | 2/2000 | Fan | |
| RE36,810 E * | 8/2000 | Arasawa et al. | 156/345.27 |
| 6,171,438 B1 | 1/2001 | Masuda et al. | |
| 6,235,640 B1 * | 5/2001 | Ebel et al. | 438/706 |
| 6,251,793 B1 | 6/2001 | Wicker et al. | |
| 6,284,093 B1 | 9/2001 | Ke et al. | |
| 6,337,277 B1 | 1/2002 | Chou et al. | |
| 6,364,957 B1 | 4/2002 | Schneider et al. | |
| 6,423,175 B1 | 7/2002 | Huang et al. | |
| 6,436,230 B1 | 8/2002 | Kondo et al. | |
| 6,489,249 B1 | 12/2002 | Mathad et al. | |
| 6,506,686 B2 | 1/2003 | Masuda et al. | |
| 6,508,911 B1 | 1/2003 | Han et al. | |
| 6,554,954 B2 | 4/2003 | Ma et al. | |

(Continued)

FOREIGN PATENT DOCUMENTS

| | | | |
|---|---|---|---|
| JP | 11026563 A | | 1/1999 |
| JP | 2000208492 A | * | 7/2000 |
| JP | 2002009042 A | | 1/2002 |
| JP | 2002016126 A | | 1/2002 |

*Primary Examiner* — Anita Alanko
(74) *Attorney, Agent, or Firm* — Duane Morris LLP

(57) ABSTRACT

A method for preventing the formation of contaminating polymeric films on the backsides of semiconductor substrates includes providing an oxygen-impregnated focus ring and/or an oxygen-impregnated chuck that releases oxygen during etching operations. The method further provides delivering oxygen gas to the substrate by mixing oxygen in the cooling gas mixture, maintaining the focus ring at a temperature no greater than the substrate temperature during etching and cleaning the substrate using a two step plasma cleaning sequence that includes suspending the substrate above the chuck.

19 Claims, 5 Drawing Sheets

(56) References Cited

U.S. PATENT DOCUMENTS

| | | |
|---|---|---|
| 6,562,186 B1 | 5/2003 | Saito et al. |
| 6,723,202 B2 | 4/2004 | Nagaiwa et al. |
| 2002/0019745 A1* | 2/2002 | Yamagiwa et al. ............... 705/1 |
| 2002/0151138 A1* | 10/2002 | Liu ............................... 438/261 |
| 2003/0106646 A1 | 6/2003 | Ma et al. |
| 2006/0102288 A1 | 5/2006 | Satoh et al. |

* cited by examiner

a divisional application of U.S. patent application Ser. No. 10/765,808, filed on Jan. 27, 2004 now U.S. Pat. No. 7,713,380, the contents of which are hereby incorporated by reference as if set forth in their entirety.

METHOD FOR BACKSIDE POLYMER REDUCTION IN DRY-ETCH PROCESS

RELATED APPLICATION

This application is a divisional application of U.S. patent application Ser. No. 10/765,808, filed on Jan. 27, 2004 now U.S. Pat. No. 7,713,380, the contents of which are hereby incorporated by reference as if set forth in their entirety.

FIELD OF THE INVENTION

The present invention relates, most generally, to semiconductor devices and methods for forming the same. More particularly, the present invention relates to a method for backside polymer reduction in dry etching operations.

BACKGROUND

Yield enhancement is a goal in virtually all manufacturing processes including manufacturing processes used in the semiconductor manufacturing industry. In the semiconductor manufacturing industry where device feature sizes can be in the nanometer range, there is a close correlation between device yield and contamination levels. Semiconductor devices are especially sensitive to particle contamination and the presence of one very small particle can destroy an entire semiconductor device. It is therefore desirable to reduce particle contamination in each of the multitude of manufacturing processes used to form a semiconductor device.

Dry etching processes, also referred to as plasma etching processes, are carried out to etch various films at various stages of the semiconductor manufacturing operation and produce various device features. Multiple plasma etching operations are generally required to form a semiconductor device. One shortcoming of such plasma etching operations is the generation of polymers as etch by-products within the etching chamber. The polymers can adhere to various surfaces within the etch chamber and become dislodged, contaminating the chamber. One particularly prevalent and problematic location where polymer buildup is common, is the backside of a semiconductor substrate being etched, particularly at the peripheral edge of the substrate. When a polymer film is formed on the peripheral edge of a semiconductor substrate, any jarring of the substrate or movement of the substrate which causes the edge of the substrate to contact another surface, typically causes the polymeric film to delaminate and flake. This generates particles that may fall immediately on the top, device side of the substrate or at least contaminate the chamber in which the substrate is located, which may ultimately result in device contamination and failure. The generation of backside polymeric films is especially prevalent in dielectric etching operations, in particular etching operations that utilize $C_xF_yH_z$ chemistries such as $C_5F_8$, $C_4F_6$, $CH_2F_2$, and $CHF_3$. Using conventional technologies, the polymer buildup on the backside of the substrate being etched, particularly on the beveled peripheral edge, may include a thickness ranging from 1000 angstroms to 6000 angstroms. Such a thick polymer film can result in the generation of considerable particle contamination which can destroy devices and lower yield.

It would therefore be desirable to provide etching processes, in particular plasma etching processes for etching dielectric materials, that eliminate or at least reduce the formation of contaminating polymeric films on semiconductor substrates.

SUMMARY OF THE INVENTION

To achieve these and other objects and in view of its purposes, the present invention addresses the shortcomings of conventional plasma etching process technologies and provides a plasma etching operation that reduces contamination by preventing or reducing the formation of polymeric films on the substrates being etched.

In one exemplary embodiment, the present invention provides a plasma etching apparatus comprising a chuck for retaining a substrate and additional hardware that includes oxygen therein such that the oxygen is released when an etching operation is carried out. In one embodiment, the additional hardware may be a focus ring that surrounds the chuck.

In another exemplary embodiment, the present invention provides a plasma etching apparatus comprising a chuck for retaining a substrate, and a focus ring. At least one of the chuck and the focus ring includes oxygen therein such that the oxygen is released when an etching operation is carried out.

In another exemplary embodiment, the present invention provides a plasma etching apparatus comprising an etch chamber including therein a chuck for retaining a substrate and a focus ring. The focus ring is maintainable at a temperature no greater than the temperature of the substrate while an etching operation is carried out in the etch chamber.

In yet another exemplary embodiment, the present invention provides a method for etching a semiconductor device on a substrate. The method includes providing an etching tool that includes a chuck for retaining a substrate therein and an oxygen-impregnated focus ring therein. The method further provides for performing an etch operation such that the oxygen is liberated.

According to a further exemplary embodiment, the present invention provides a method for etching a substrate comprising providing an etching apparatus including an etching chamber having therein a chuck for retaining a semiconductor substrate and a focus ring. The method further provides for etching a film on a substrate disposed on the chuck, maintaining the focus ring at a temperature no greater than the temperature of the substrate, and maintaining at least a portion of the focus ring in contact with the chuck during etching.

In still another exemplary embodiment, the present invention provides a method for etching a substrate comprising providing a substrate on a chuck, etching the substrate, generating an oxygen plasma and performing a clean operation while the substrate is on the chuck, and further generating a further oxygen plasma and performing a further clean operation while the substrate is spaced above the chuck or further chuck.

In another exemplary embodiment, the present invention provides a method for etching a semiconductor substrate comprising providing an etching tool having an etch chamber including a semiconductor substrate disposed on a chuck and substantially peripherally surrounded by a focus ring that includes oxygen incorporated therein. An etching operation is performed such that the oxygen is liberated and the method further includes maintaining the focus ring in contact with the chuck and at a temperature no greater than the temperature of the substrate during the etching operation. After the etching operation is performed, the method further provides for generating an oxygen plasma and cleaning the semiconductor substrate with the oxygen plasma while the semiconductor substrate is disposed on the chuck and, after the etching operation, generating a further oxygen plasma and further cleaning the semiconductor substrate with the further oxygen plasma while the semiconductor substrate is spaced over the chuck. A mixture of helium and oxygen is directed through openings formed in the chuck or the further chuck in a cooling operation.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures:

FIG. 7A shows particle contaminants being retained by a substrate according to the PRIOR ART and FIG. 7B shows an aspect of the present invention that illustrates polymeric material being attracted away from the substrate.

DETAILED DESCRIPTION

The present invention is directed to a method and apparatus for eliminating or preventing the formation of polymer film on the backside of a substrate, also known as a wafer, during dry/plasma etching operations used to pattern films or other features formed on the front side of the substrate. The present invention applies to various substrate sizes and various substrate materials upon which semiconductor devices are formed. Silicon and gallium arsenide are examples of semiconductor substrate materials commonly used in today's semiconductor manufacturing industry. The method and apparatus of the present invention applies to various plasma etching tools manufactured by various equipment manufacturers. The method and apparatus of the present invention may be used in various types of dry etching operations used to etch various films at various stages in the semiconductor device manufacturing processing sequence. Reactive ion etching, RIE, is such an exemplary dry etching operation.

Figure 1:
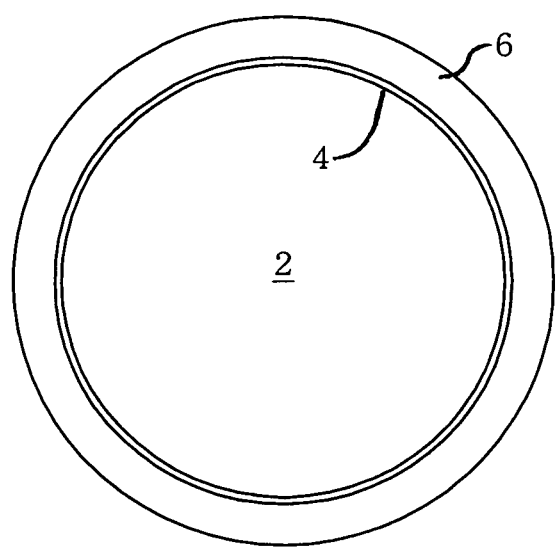
FIG. 1 is a top view showing an exemplary arrangement of an apparatus according to the present invention.

FIG. 1 is a top view of an exemplary arrangement between wafer 2 and focus ring 6. Beneath wafer 2 and not visible in FIG. 1, is a chuck which retains wafer 2. Wafer 2 may sit securely on the chuck due to gravity, vacuum, or various other mechanical clamping means. In other exemplary embodiments, the chuck may further extend peripherally about peripheral edge 4 of wafer 2. Focus ring 6 is generally annular in shape and continuously surrounds peripheral edge 4 of wafer 2 which is generally round. Focus ring 6 is used to prevent arcing and to maintain the integrity of the plasma during plasma, or dry etching operations.

The components illustrated in FIG. 1 may be disposed in the etch chamber of various dry etching tools. An aspect of the present invention is the presence, in the etch chamber, of hardware in which oxygen is incorporated such that the oxygen is liberated during a plasma etching operation. The release of oxygen in the vicinity of wafer edge 4 prevents the formation of polymeric films on the underside of substrate 2 particularly in the edge region, for example.

Figure 2:
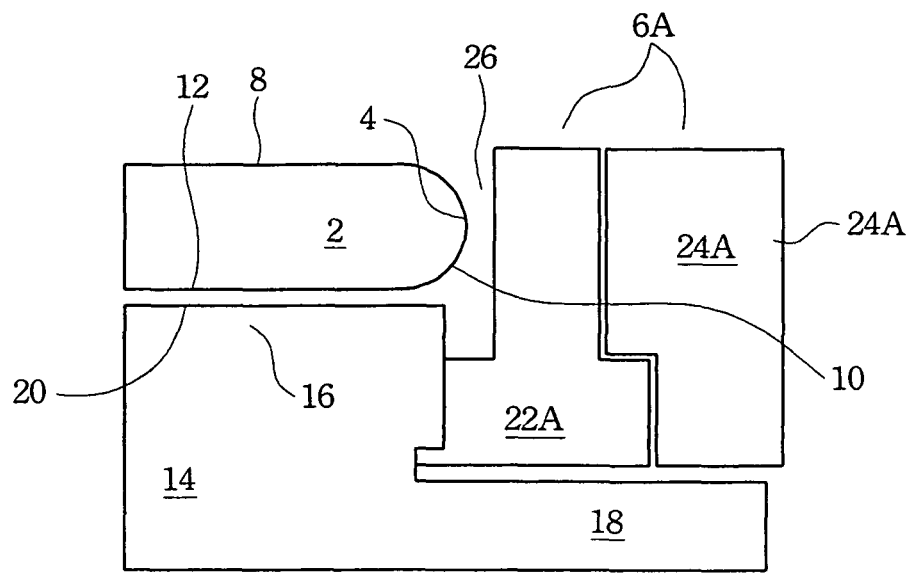
FIG. 2 is a cross-sectional view showing an exemplary configuration of an exemplary oxygen-containing focus ring according to the present invention.
Figure 3:
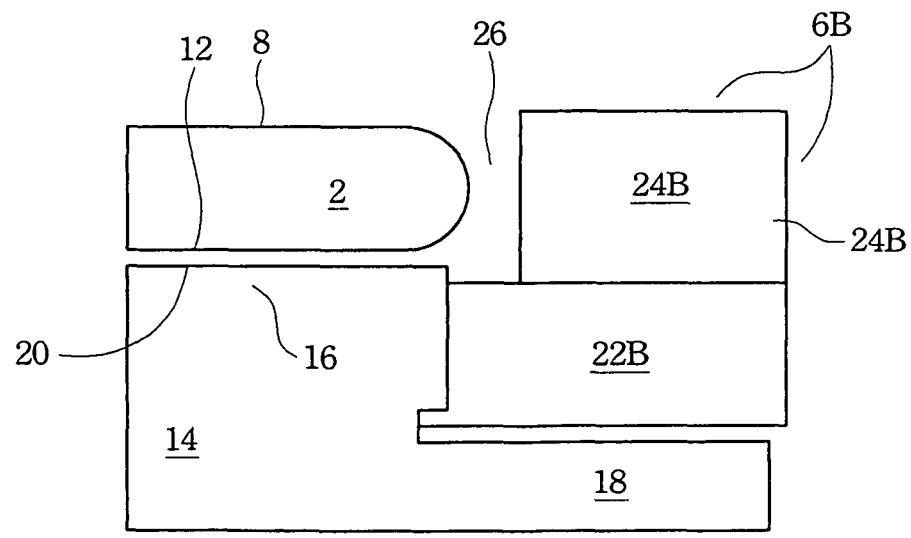
FIG. 3 is a cross-sectional view showing an exemplary configuration of another exemplary oxygen-containing focus ring according to the present invention.

FIGS. 2 and 3 illustrate two exemplary embodiments of the oxygen-containing hardware aspect of the present invention. Each of FIGS. 2 and 3 are cross-sectional views of a peripheral portion of wafer 2 which is shown in FIG. 1 to be generally circular in shape. Referring to each of FIGS. 2 and 3, wafer 2 may be formed of silicon, gallium arsenide or any of various other substrate materials commonly used in the semiconductor manufacturing industry. Wafer 2 is seated on chuck 14. Chuck 14 includes pedestal portion 16 which receives wafer 2 thereon and has approximately the same shape as the wafer it receives, and chuck 14 also includes peripheral portion 18 that extends peripherally exterior to the circumference, or edge, of wafer 2. Wafer 2 and corresponding pedestal portion 16 are generally round and may be of various dimensions. In an exemplary embodiment, chuck 14 may be an electrostatic chuck (ESC). Wafer 2 includes top surface 8 which includes semiconductor devices being fabricated thereon, and bottom surface 12, including underside edge 10 which is beveled in the illustrated embodiment. Bottom surface 12 is generally considered the backside or underside of wafer 2. During conventional etching procedures used in the prior art, polymer buildup on underside edge 10 is prevalent and can lead to contamination when the polymeric film flakes off or is otherwise disengaged from wafer 2. Peripherally surrounding wafer 2 is focus ring sets 6A, 6B in FIGS. 2 and 3, respectively. Focus ring sets 6A and 6B each include two components in the exemplary embodiments illustrated in FIGS. 2 and 3: oxygen-containing focus ring sections 22A and 22B; and further focus ring sections 24A and 24B. Oxygen-containing focus ring sections 22A and 22B include oxygen within the focus ring material and are designed so that oxygen is released during an etching process and in a particular embodiment, so that oxygen will be released during a $C_xF_yH_z$ etching process. Various oxygen-containing materials, and various techniques for impregnating oxygen into other materials, may be used to form oxygen-containing focus ring sections 22A and 22B. In an exemplary embodiment, oxygen-containing focus ring sections 22A and 22B may be formed of quartz and in another exemplary embodiment they may be formed of other ceramic materials. In FIG. 2, oxygen-containing focus ring section 22A extends peripherally around circumferential edge 4 of wafer 2 as well as extending peripherally below circumferential edge 4 of wafer 2. In FIG. 3, oxygen-containing focus ring section 22B is disposed just beneath bottom surface 12 of wafer 2 and extends peripherally around wafer 2.

Oxygen-containing focus ring section 22A may be designed in conjunction with various different etch operations to ensure that oxygen is released during the associated plasma etch operation, i.e. the oxygen content and structure within the focus ring material are chosen to assure release of oxygen for a given set of etch conditions such as etch chemistry, power, bias, and so forth. In one exemplary embodiment, oxygen-containing focus ring section 22A may be designed so that oxygen is released during etch processes used to etch dielectric materials such as low-k materials. In an exemplary embodiment, oxygen-containing focus ring section 22A may be formed of quartz, $SiO_2$, which reacts with a $C_xF_yH_z$ plasma to release oxygen according to the following equation:

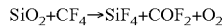
$$SiO_2 + CF_4 \rightarrow SiF_4 + COF_2 + O_2$$

Gap 26 is designed to be sufficiently small, with respect to the diameter of wafer 2, to insure $O_2$ release proximate to peripheral edge 4. The oxygen within gap 26 reduces the concentration of carbon-containing species within gap 26 by reacting with these carbon species, and thereby prevents the formation of a carbon-containing polymer layer on underside edge 10 of wafer 2. Underside edge 10 of wafer 2 is shown as beveled in the exemplary embodiment. According to an exemplary embodiment of the invention, the concentration of carbon-containing species within gap 26 is significantly less than the concentration of the carbon-containing species above top surface 8 of wafer 2.

The two piece focus ring set illustrated in FIGS. 2 and 3 is exemplary only and other arrangements may be used. In another exemplary embodiment, focus ring set 6 may take the form of a single focus ring having all or part of the focus ring containing oxygen. Applicants have discovered that the use of various oxygen-containing focus ring embodiments of this aspect of the present invention, prevents a polymer film of a thickness greater than 500 angstroms from forming on underside edge 10 of wafer 2 during various dielectric etching processes that use $C_xF_yH_z$ etching chemistries.

In another exemplary embodiment, at least a portion of chuck 14 is formed of an oxygen-containing material such that the oxygen will be released during reaction with the etching plasma as described above in conjunction with oxygen-containing focus ring sections 22A and 22B. In this exemplary embodiment, the oxygen liberated from chuck 14 during the etching operation, similarly restricts the formation of a polymer film on the backside of wafer 2. In one exemplary embodiment, chuck 14 may be coated with an oxygen-containing material.

In another exemplary embodiment, each of a portion of the focus ring sets 6A or 6B and chuck 14 may have oxygen incorporated therein such that the oxygen from either or both of the oxygen-containing components is released by reaction with etch gases during an etch operation. In yet another exemplary embodiment, other hardware within the etch chamber may be formed of an oxygen-containing material such that oxygen is released during an associated etching operation.

Figure 4:
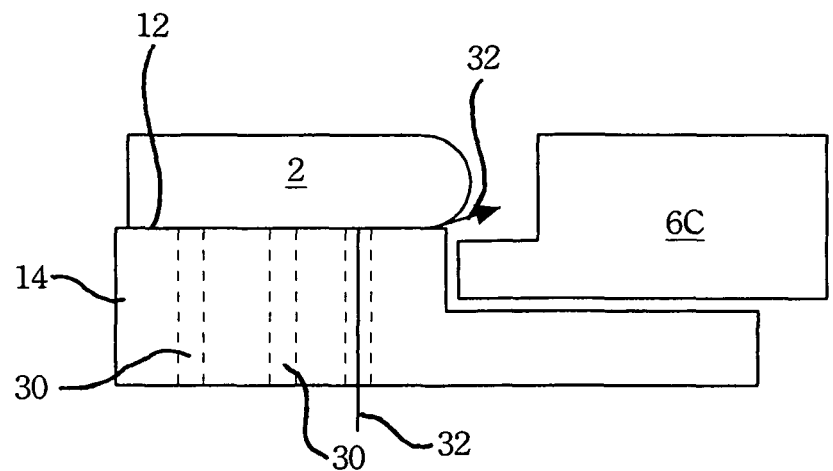
FIG. 4 is a cross-sectional view showing an exemplary cooling feature of the present invention.

Another aspect of the present invention is providing oxygen to the substrate region during or after an etching operation through a plurality of conduits 30 that extend through pedestal portion 16 of chuck 14 as shown in FIG. 4. According to this embodiment, oxygen may be mixed with helium and directed to the wafer for cooling or other purposes such as within gas mixture flow 32 which is directed to wafer 2 through conduits 30. The shape and orientation of conduits 30 is intended to be exemplary only. The presence of oxygen in the substrate area further reduces polymerization on bottom surface 12 of wafer 2 as discussed above in conjunction with the oxygen liberated from the focus ring set and/or the chuck. Gas mixture flow 32 may be directed toward wafer 2 either during or after an etching operation, or both.

Figure 5:
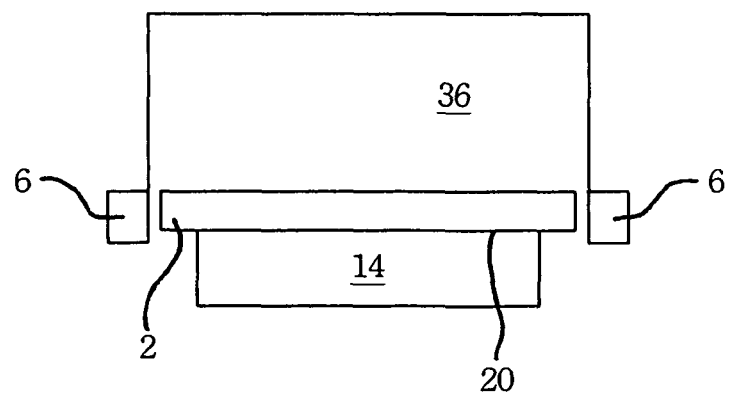
FIGS. 5 and 6 are cross-sectional views showing two operations in an exemplary cleaning sequence according to the present invention.
Figure 6:
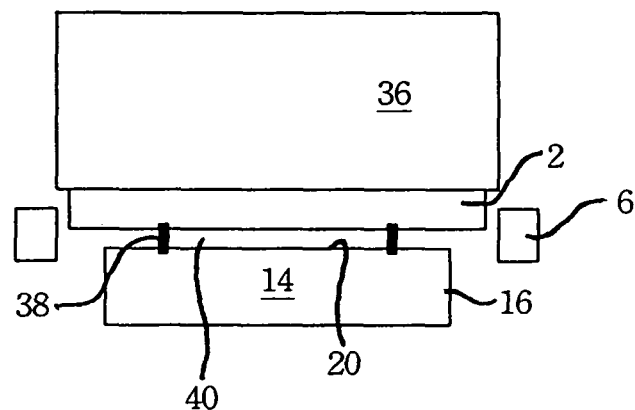

In another aspect, the present invention utilizes oxygen plasma in a sequence of plasma cleaning operations to prevent or reduce backside polymer buildup. The oxygen cleaning operations may be carried out either in-situ or ex-situ with the corresponding plasma etching operation(s). After an etching operation, a first $O_2$ plasma cleaning step is carried out during which wafer 2 rests on surface 20 of pedestal portion 16 of chuck 14 as shown in FIG. 5. Plasma 36 is an $O_2$ plasma and includes characteristics suitable for cleaning. Chuck 14 may be an ESC in an exemplary embodiment. FIG. 6 shows the subsequent step in an exemplary cleaning sequence and shows wafer 2 suspended over chuck 14 by pins 38. It can be seen that gap 40 exists between wafer 2 and top surface 20 of pedestal portion 16. Various other means for spacing wafer 2 above surface 20 may be used in other exemplary embodiments. Various oxygen plasma cleaning procedures may be used in both the pin-down and pin-up cleaning operations. In one exemplary embodiment, each of the etch operation, the pin-down $O_2$ plasma cleaning operation (FIG. 5) and the pin-up $O_2$ plasma cleaning operation (FIG. 6) may be carried out in the same etching chamber. In another exemplary embodiment, two or more of the aforementioned operations may occur at different locations; i.e., over different chucks 14 or in different etching chambers altogether. In an exemplary embodiment, the sequence of $O_2$ plasma cleaning operations may take place after a dielectric or a low-k material has been etched. In one exemplary embodiment, the pin-up cleaning operation may be carried out first, followed by the pin-down cleaning operation. In one exemplary embodiment, after a dielectric having a dielectric constant less than 3.2 has been etched, the pressure during the $O_2$ plasma cleaning operations may be less than 100 millitorr. In another exemplary embodiment, after a dielectric having a dielectric constant greater than 3.2 has been etched, a pressure of more than 50 millitorr may be used in either or both of the $O_2$ cleaning operations. Various other suitable pressures and other processing parameters may be used in other exemplary embodiments.

Figure 7A:
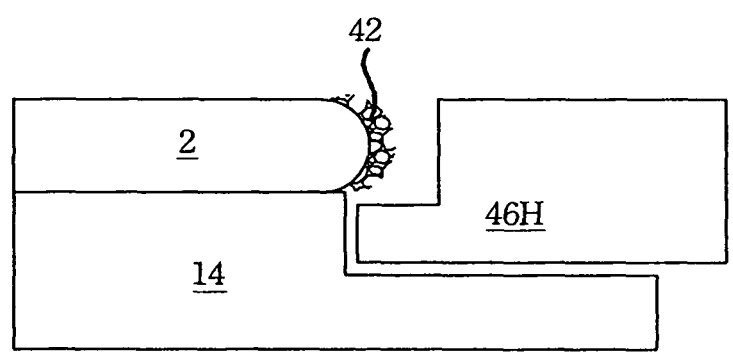
FIGS. 7A and 7B are cross-sectional views illustrating a cleaning aspect of the present invention.
Figure 7B:
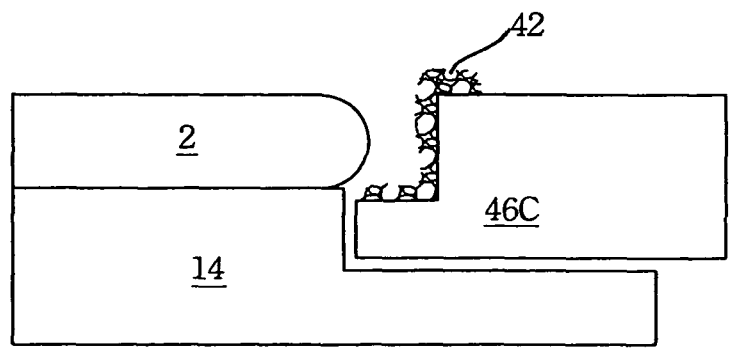

In another aspect, the present invention provides for maintaining the focus ring or focus ring set at a comparatively cool temperature to decrease polymer adhesion to a semiconductor substrate. The sticking coefficient of radicals such as polymeric radicals that may be produced as etch by-products during etching operations, increases when surface temperatures are reduced. FIG. 7 shows a prior art arrangement and illustrates polymer 42 adhering to wafer 2 in a conventional arrangement in which the temperature of hot focus ring 46H exceeds the temperature of wafer 2. The present invention addresses this concern and provides cool focus ring 46C such as shown in FIG. 7B. When the temperature of the cool focus ring 46C is below the temperature of substrate 2, the sticking coefficient favors polymer 42 adhering to the cold focus ring 46C. The present invention provides for furnishing a cooling effect to cool focus ring 46C as show in FIG. 8.

Figure 8:
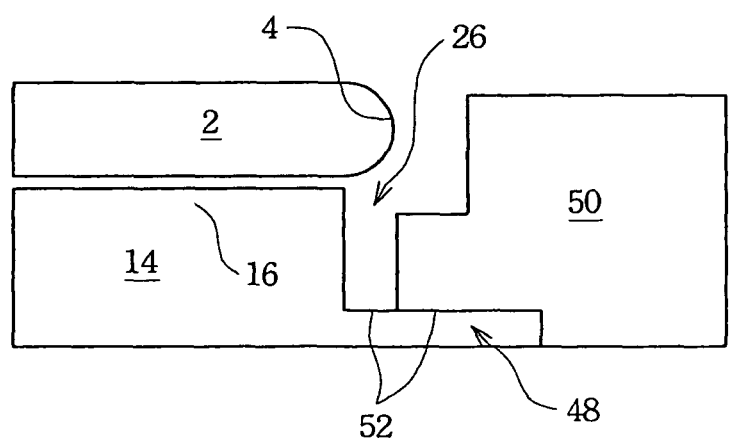
FIG. 8 shows a focus ring/pedestal arrangement that allows for cooling and the prevention of particle buildup on a substrate, according to another aspect of the present invention.

In the exemplary embodiment shown in FIG. 8, wafer 2 is disposed on chuck 14 which may be an ESC. The components may be disposed in the etch chamber of various dry etching tools. Gap 26 is retained peripherally between wafer 2 and focus ring 50 in the illustrated embodiment. In addition to pedestal portion 16, chuck 14 includes landing 52 which extends peripherally around an outer circumference formed by wafer edge 4. Focus ring 50 maintains thermal contact with chuck 14 as surface 52 of focus ring 50 forms a conterminous boundary with annular landing 48. Focus ring 50 therefore extends peripherally around wafer 2 and has an annular shape. Chuck 14 may be cooled externally using various conventional techniques. In one exemplary embodiment, chuck 14 may be cooled by cycling a coolant such as mixture of deionized water and an organic solvent, throughout chuck 14. In various conventional etching operations, wafer 2 may achieve temperatures in the vicinity of 90° C. to 100° C. during the etch operation. In one exemplary embodiment, chuck 14 may be maintained at a temperature of at least 50° C. less than the temperature of wafer 2 during an etch operation. Chuck 14 may be maintained at a temperature of about 20-30° C. in one exemplary embodiment. According to conventional, prior art, processing such as shown in FIG. 7A in which focus ring 46H is not cooled, focus ring 46H may attain temperatures as high as 150° C. during etching. According to the thermal contact aspect of the present invention as illustrated in FIG. 8, focus ring 50 may be maintained at a temperature no greater than the temperature of wafer 2 due to the lower thermal conductivity material of the focus ring and the thermal contact between focus ring 50 and chuck 14 which is actively cooled.

The preceding merely illustrates the principles of the invention. It will thus be appreciated that those skilled in the art will be able to devise various arrangements which, although not explicitly described or shown herein, embodied the principles of the invention and are included within its scope and spirit. For example, the various aspects of the present invention may be used in combination. Furthermore, all examples and conditional language recited herein are principally intended expressly to be only for pentagonal purposes and to aid in illustrating the principles of the present invention and the concepts contributed by the inventors to furthering the art, and are to be construed as being without limitation to such specifically recited examples and conditions. Moreover, all statements herein reciting principles, aspects, and embodiments to the invention, as well as specific examples thereof, are intended to encompass both structural, functional, and procedural equivalents thereof. Additionally, it is intended that such equivalents include both currently known equivalents and equivalents developed in the future, i.e., any elements developed that perform the same function regardless of structure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for etching a substrate comprising:
providing an etching apparatus including an etching chamber having therein a chuck and a focus ring;
etching a film on a substrate disposed on said chuck; and
maintaining said focus ring at a temperature less than a temperature of said substrate and maintaining at least a portion of said focus ring in direct contact with said chuck, during said etching.

2. The method as in claim 1, wherein said focus ring is an oxygen containing focus ring; and
wherein oxygen is liberated during said etching.

3. The method as in claim 2, wherein said etching includes an etching gas including carbon, fluorine and hydrogen.

4. The method as in claim 2, further comprising cooling said substrate with a gas that includes oxygen.

5. The method as in claim 4, wherein said gas further includes helium and said cooling comprises directing said gas through openings in said chuck.

6. The method as in claim 1, wherein said maintaining and said etching occur substantially simultaneously and said maintaining includes maintaining said focus ring at a temperature about 50° C. lower than a temperature of said substrate.

7. The method as in claim 1, wherein said focus ring is formed of quartz, said chuck comprises an electrostatic chuck and said focus ring peripherally surrounds said chuck and includes a portion that extends inwardly beneath a peripheral edge of said chuck that is disposed directly underneath a peripheral portion of said substrate.

8. A method for etching a substrate comprising:
providing a substrate on a chuck peripherally surrounded by a focus ring that includes a portion that extends inwardly beneath a peripheral edge of said chuck that is disposed directly underneath a peripheral portion of said substrate;
etching said substrate;
generating an oxygen plasma and performing a clean operation while said substrate is on said chuck; and
further generating a further oxygen plasma and performing a further clean operation while said substrate is positioned above said chuck or a further chuck.

9. The method as in claim 8, wherein said providing a substrate comprises providing a semiconductor substrate on said chuck, said semiconductor substrate including a dielectric layer formed thereon, and said etching comprises etching said dielectric layer.

10. The method as in claim 8, wherein said generating and said further generating are performed in in-situ.

11. The method as in claim 8, wherein said etching includes using an etching gas that includes carbon, fluorine and hydrogen.

12. The method as in claim 8, wherein said further generating includes said substrate spaced above said chuck by pins that extend above said chuck.

13. The method as in claim 9, wherein said dielectric layer includes a dielectric constant less than 3.2 and at least one of said first generating and said further generating includes a pressure less than 100 mT.

14. The method as in claim 9, wherein said dielectric layer includes a dielectric constant greater than 3.2 and at least one of said generating and said further generating includes a pressure greater than 50 mT.

15. A method for etching a semiconductor substrate comprising:
providing an etching tool having an etch chamber including a semiconductor substrate disposed on a chuck and substantially peripherally surrounded by a focus ring that includes oxygen therein;
performing an etching operation such that said oxygen is liberated;
during said performing, maintaining said focus ring at a temperature less than a temperature of said semiconductor substrate and at least partially in contact with said chuck;
after said performing, generating an oxygen plasma and cleaning said semiconductor substrate with said oxygen plasma while said semiconductor substrate is disposed on said chuck;
after said performing, generating a further oxygen plasma and further cleaning said semiconductor substrate with said further oxygen plasma while said semiconductor substrate is spaced over said chuck or a further chuck; and cooling by directing a mixture of helium and oxygen through openings formed in said chuck or said further chuck.

16. The method as in claim 15, wherein said maintaining comprises maintaining said focus ring at a temperature of about 50° C. less than said temperature of said semiconductor substrate.

17. The method as in claim 15, wherein said providing includes said focus ring including a focus ring portion that extends underneath said chuck and said substrate.

18. The method as in claim 17, wherein said focus ring portion is disposed directly underneath a peripheral portion of said chuck that is disposed directly underneath a peripheral portion of said substrate.

19. The method as in claim 2, wherein said maintaining includes maintaining said focus ring at a temperature of about 50° C. lower than a temperature of said substrate.

* * * * *